United States Patent [19]

Kubo

[11] Patent Number: 5,576,937
[45] Date of Patent: Nov. 19, 1996

[54] CONNECTOR INCLUDING A CONNECTOR BODY, AN ANNULAR AIR-TIGHT MATERIAL AND A CLOSURE PLATE TO SEAL AN IC

[75] Inventor: Masaaki Kubo, Tokyo, Japan

[73] Assignee: Yamaichi Electronics Co., Ltd., Tokyo, Japan

[21] Appl. No.: 229,766

[22] Filed: Apr. 19, 1994

[30]      Foreign Application Priority Data

Apr. 19, 1993   [JP]   Japan  .................................... 5-116554

[51] Int. Cl.$^6$ ............................ H05K 5/06; H05K 7/12; B65D 88/46; B65D 88/50
[52] U.S. Cl. ................ 361/820; 174/17 GF; 174/17 CT; 174/17 VA; 174/17.05; 174/50.5; 220/202; 220/224; 220/221; 220/222; 220/227; 220/240; 439/71; 439/73
[58] Field of Search ............................ 174/17 GF, 17 R, 174/17 VA, 17 CT, 17.05, 50.5, 50, 50.56, 50.59, 52.1, 52.3; 220/202–209, 215, 224, 214, 221, 222, 225, 226, 227, 240; 257/678, 681, 701, 704, 721; 361/785, 728, 730, 807, 809, 820; 277/901; 439/42, 68, 70–73, 734, 736; 206/701, 702

[56]      References Cited

U.S. PATENT DOCUMENTS

| | | | |
|---|---|---|---|
| 4,675,472 | 6/1987 | Krumme et al. | 174/52.3 |
| 5,034,568 | 7/1991 | Mather | 174/52.3 |
| 5,247,424 | 9/1993 | Harris et al. | 174/52.3 |
| 5,268,814 | 12/1993 | Yakubowski | 174/52.3 |

FOREIGN PATENT DOCUMENTS

| | | | |
|---|---|---|---|
| 2686764 | 7/1993 | France | 174/52.3 |
| 2617633 | 11/1977 | Germany | 174/52.3 |
| 2-228111 | 9/1990 | Japan | 174/52.3 |
| 2244390 | 11/1991 | United Kingdom | 174/52.3 |

Primary Examiner—Donald A. Sparks
Attorney, Agent, or Firm—Wenderoth, Lind & Ponack

[57]      ABSTRACT

A connector for protecting an IC comprising a connector body, a closed plate, and an annular air-tight sealing material. An air-tight chamber is formed centrally of the annular air-tight sealing material by compressing the annular air-tight sealing material between the connector main body and the closed plate. The IC is received in the air-tight chamber so as to be electrically contacted with the connector body.

23 Claims, 7 Drawing Sheets

CONNECTOR INCLUDING A CONNECTOR BODY, AN ANNULAR AIR-TIGHT MATERIAL AND A CLOSURE PLATE TO SEAL AN IC

BACKGROUND OF THE INVENTION

1. Field of the Invention

This invention relates to a connector for protecting an IC which includes an air-tight chamber for receiving the IC, so that an electrical contact with the IC is achieved within the air-tight chamber.

2. Prior Art

When an IC is placed in a condition that the IC contacts the air, the outer surface of the contact member is oxidized or dust attaches to the surface, which naturally causes a loss of reliability for electrical connections. Particularly, in the case where the IC is a bear chip, if an oxide film exists on the surface of the contact member, inferior bonding (inferior connection) occurs when the IC is packaged. This is a common cause of the production of inferior goods.

IC chips are molded of insulative materials. The problem of oxidation is, in most cases, appears in burn-in and similar testing before molding.

OBJECT AND SUMMARY OF THE INVENTION

It is a general object of the present invention to provide a connector for protecting an IC, in which the IC is effectively prevented from being oxidized.

According to the present invention, there is provided, in order to achieve the above object, a connector for protecting an IC comprising a connector body, a closed plate, an annular air-tight sealing material, and an air-tight chamber formed by the annular air-tight sealing material by compressing the annular sealing material between the connector main body and the closed plate. The IC is received in the air-tight chamber so as to be electrically contacted with the connector body.

From another aspect of the invention, there is also provided a connector for protecting an IC comprising a connector body, a closed plate, an annular air-tight sealing material, and air-tight chamber formed by the annular air-tight sealing material by compressing the annular air-tight sealing material between the connector main body and the closed plate. The IC is received in the air-tight chamber so as to be electrically contacted with the connector body. Male terminals, extending from contacts to be electrically contacted with the IC arranged within the air-tight chamber, are implanted into and piercing through the connector body, and the piercing portion of each of the male terminals is sealed with a sealing material.

With a connector for protecting an IC thus constructed according to the present invention, an air-tight chamber can easily be formed in a connector body simply by closing a closing plate with an annular air-tight sealing material which is interposed between the closing plate and the connector body, and an IC received in the air-tight chamber can effectively be prevented from being oxidized by filling the air-tight chamber with an oxidation preventive gas or in a similar manner. The oxidation preventive gas is filled in the air-tight chamber through a gas inlet port which is formed in the connector body or closing plate. Otherwise, the IC is inserted into the connector body in an atmosphere of the oxidation preventive gas.

Alternatively, the oxidation is prevented by evacuating the air-tight chamber which is achieved by removing air through an air inlet/outlet port which is formed in the connector body or closing plate instead of filling the oxidation preventive gas in the air-tight chamber. In the case where the air-tight chamber is not filled with the oxidation preventive gas or evacuated, the surface of the contact member can effectively be prevented from dust or dirt attached thereto, by accommodating the IC in the air-tight chamber.

DETAILED DESCRIPTION OF THE EMBODIMENT

Figure 1:
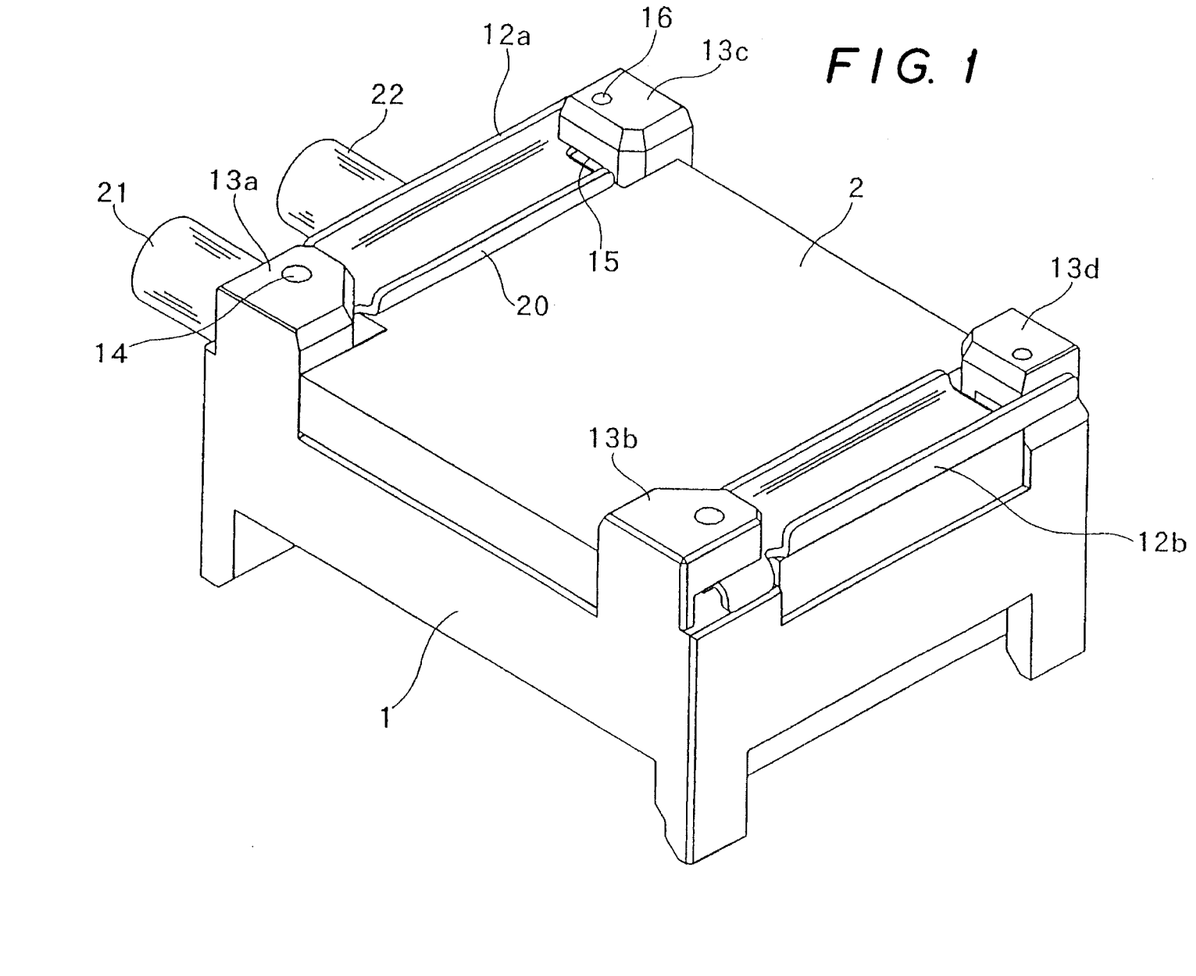
FIG. 1 is a perspective view showing an outer appearance of a connector for protecting an IC according to one embodiment of the present invention.
Figure 2:
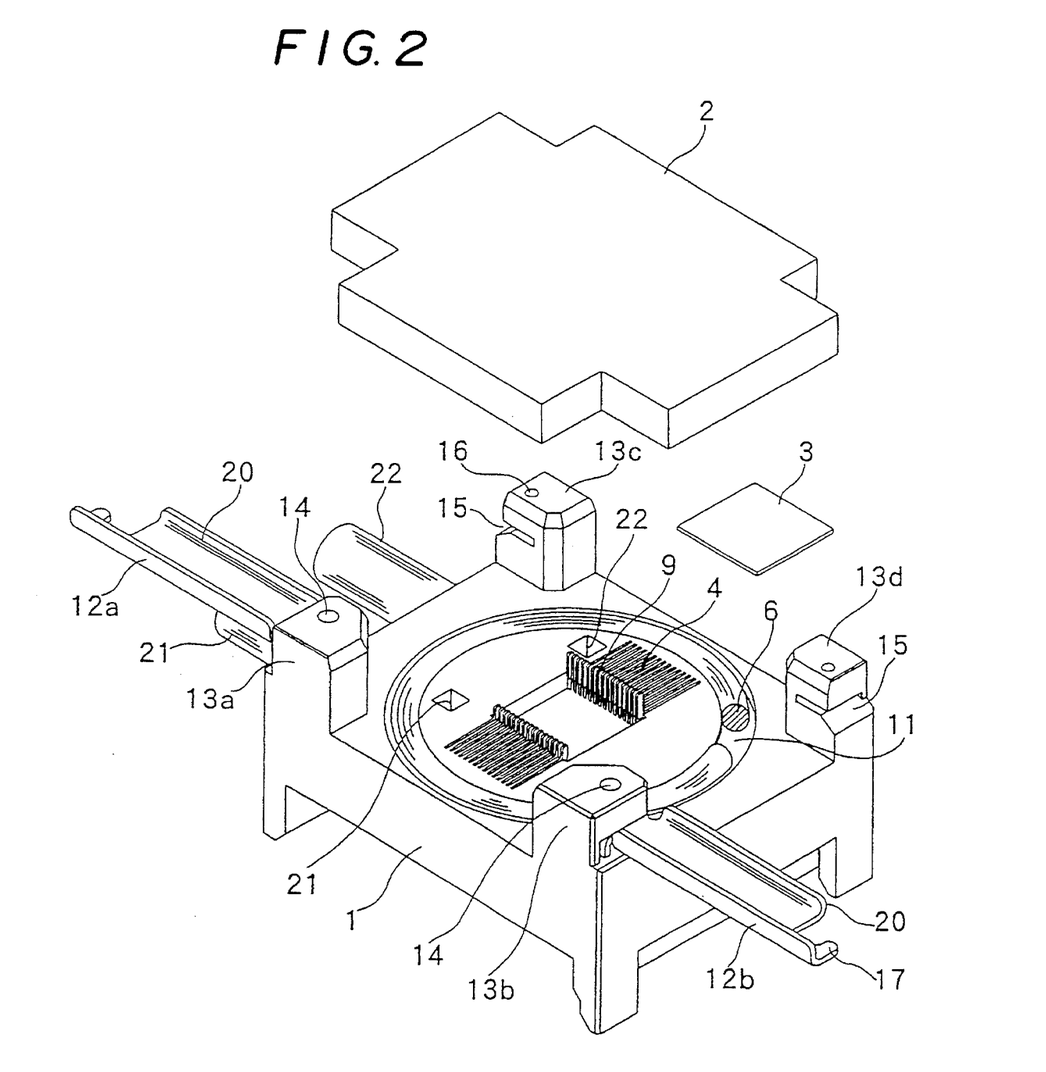
FIG. 2 is a perspective view showing the connector of FIG. 1, but in which a closing plate is opened.
Figure 3:
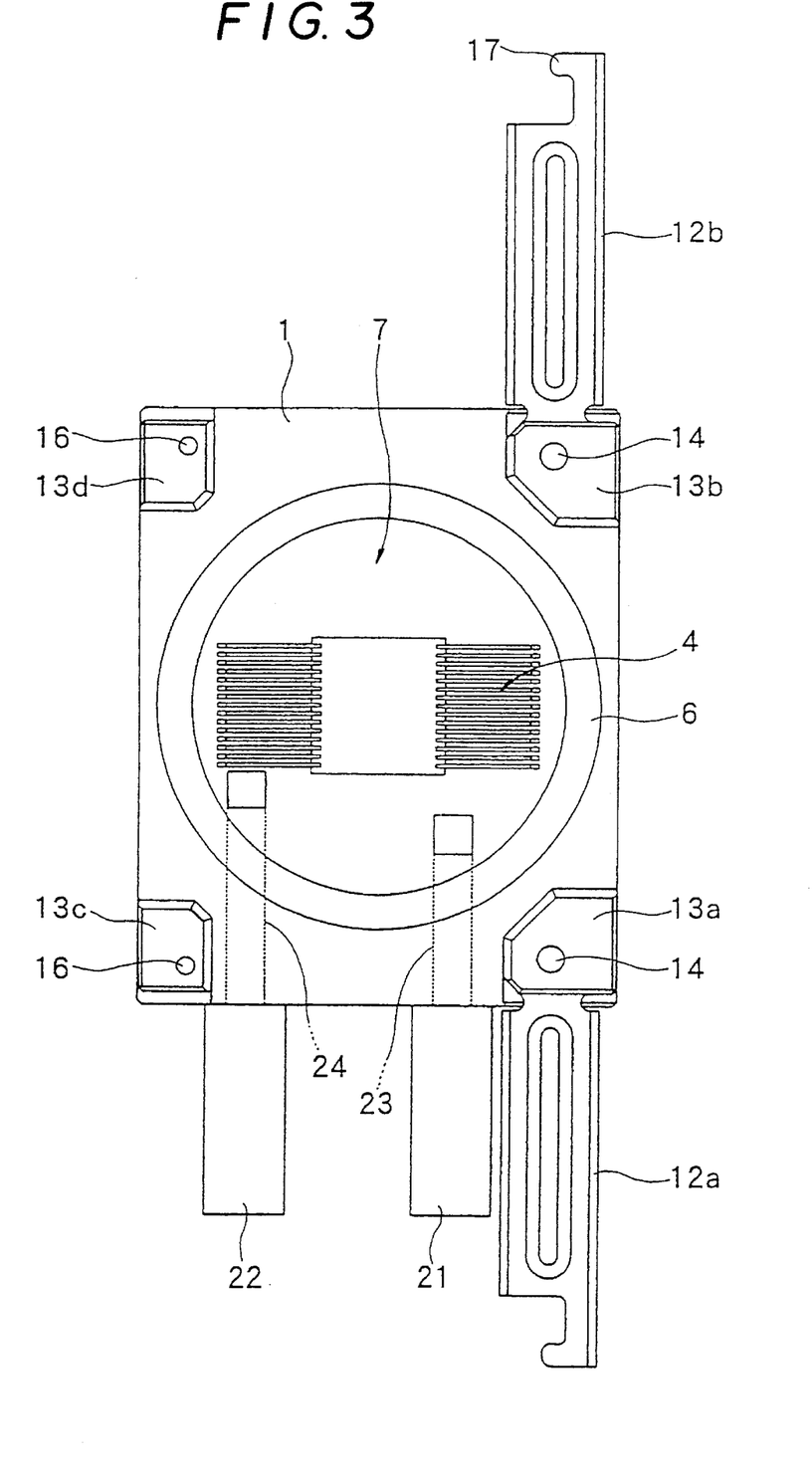
FIG. 3 is a plan view of the connector body.
Figure 4:
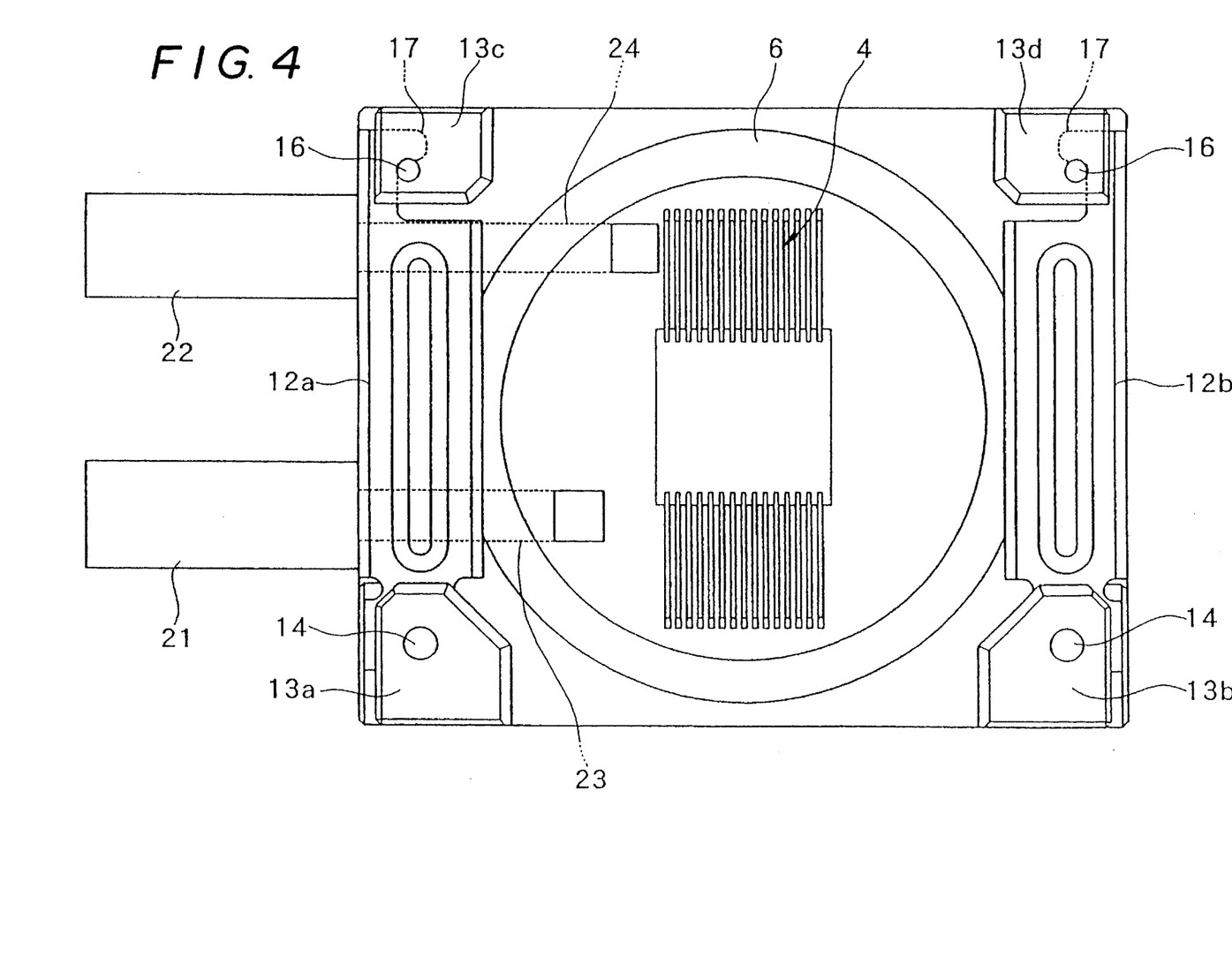
FIG. 4 is likewise a plan view of the connector body, but in which latch levers are engaged.

As shown in FIGS. 1 and 2 as well as elsewhere, a connector body 1 has a closing plate 2 which can be opened and closed relative to an upper surface of the connector body. The connector body 1 and closing plate 2 are formed of insulative materials, respectively. The connector body 1 includes a plurality of contacts 4 which are arranged in a manner suitable to contact an IC 3. By closing the closing plate 2 relative to the upper surface of the connector body 1, the IC 3 is held between the connector body 1 and the closing plate 2 and contact points 5 of the IC 3 are pressed against the contacts 4.

As means for forming an air-tight chamber 7 in the connector body 1, an annular air-tight sealing material 6 formed of a high-molecular resilient material is interposed between the connector body 1 and the IC closing member 2. As shown in FIGS. 1 and 5(C), the air-tight sealing material 6 is compressed between opposing surfaces of the closing plate 2 and connector body 1 when the closing plate 2 is closed relative to the connector body 1, thereby forming the air-tight chamber 7 at an inner area of the air-tight sealing material 6. That is, when the closing plate 2 is closed relative to the connector body 1, the annular air-tight sealing material 6 is intimately attached to and between the opposing surfaces of the closing plate 2 and connector body 1, and the air-tight chamber 7 is formed between the opposing surfaces in such a manner as to be surrounded with the air-tight sealing material 6. In this sense, the closing plate 2 of this embodiment has two roles: one as means for electrically connecting the contact points 5 of the IC 3 to the contacts 4 in a pressed condition; and the other as a means for compressing the annular air-tight sealing material 6 to form the air-tight chamber 7.

The contacts 4 are disposed within the air-tight chamber 7 and the electrical connection between the contacts 4 and IC 3 is made within the air-tight chamber 7. Each of the contacts 4 has a spring portion 8 which can be vertically flexed. The spring portion 8 is disposed within the air-tight chamber 7. A contact nose 9 facing upward is provided on a free end portion of the spring portion 8. This contact nose 9 is subjected to electrical connection with the contact point 5. Each spring portion 8 has a male terminal 10 connected to a basal end thereof. The male terminal 10 pierces through the connector body 1 for implanting each contact 4 in the connector body. That portion of the male terminal 10, which pierces through the connector body 1, extends downwardly from a lower surface of the connector body 1 so as to be subjected to electrical connection with a socket or a wiring board.

Figure 5A:
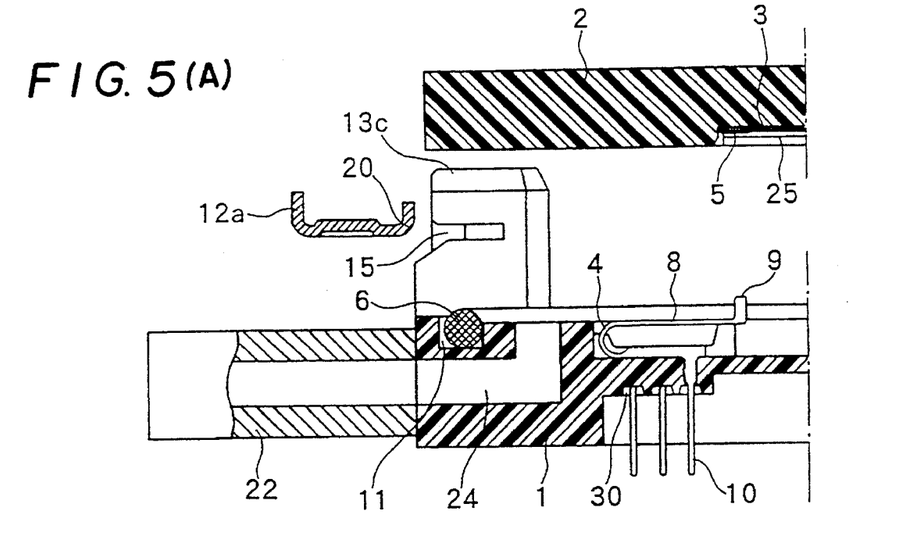
FIGS. 5(A), 5(B) and 5(C) are sectional views of the connector, in which the engagement actions of the latch levers are illustrated in a sequential manner.

As shown in FIG. 5(A), the contact nose of each contact 4 projects above an upper surface of the annular air-tight sealing material 6 at an inner area of the air-tight sealing material. During the course of compressing the annular air-tight sealing material 6 with the closing plate 2, the contact nose 9 is brought into electrical connection with a corresponding contact point 5 of the IC 3. It is designed such that the contact nose 9 of the contact 4 projects above the upper surface of the annular air-tight material 6, so that the contact nose 6 can properly electrically connect with the contact point 5 of the IC 3 in a pressed condition.

As means for retaining the air-tight sealing material 6 in the connector body 1 or closing plate 2, an arrangement is made, for example, such that an annular groove 11 surrounding the contact 4 is provided in an upper surface (i.e., surface which opposes the closing plate 2) of the connector body 1 and a lower half portion of the resilient annular air-tight sealing material 6 is engaged in the annular groove 11 with an upper portion thereof projecting upwardly from an open surface of the annular groove 11 so as to establish a compressive amount, this projecting portion being compressed by the closing plate 2. The contact nose 9 of the contact 4 projects above an upper surface of this projecting portion of the air-tight sealing material 6.

A resilient material of a rectangular sectional configuration instead of a circular sectional configuration may be used as the annular air-tight sealing material. The annular shape of the air-tight sealing material includes not only a continuous annular shape but also a partly cut annular shape. In the latter case, the cut portion of the annular air-tight sealing material becomes tightly attached upon compression.

An arrangement is possible, although not illustrated, in which the annular groove 11 is formed in a lower surface (i.e., surface which opposes the closing plate 2) of the connector body 1 and the upper half portion of the resilient annular air-tight sealing material 6 is engaged in the annular groove 11 with the lower half portion thereof projecting from the opening surface of the annular groove 11. As means for imparting a pressing force to the closing plate 2 so as to press the annular air-tight sealing material 6 and maintaining this pressing force, a pair of latch levers 12a and 12b are provided on the connector body 1.

As shown in FIGS. 1 and 2 as well as elsewhere, corner blocks 13a to 13d are integrally formed with four corner portions of the connector body 1 from insulative materials. One end of the latch lever 12a is pivotally supported for a generally horizontal pivotal movement by the corner block 13a through a shaft 14, while one end of the other latch lever 12b is likewise pivotally supported for a generally horizontal pivotal movement by the corner block 13b through another shaft 14. The other ends of the latch levers 12a and 12b are removably engaged with the remaining corner blocks 13c and 13d, respectively.

Figure 6:
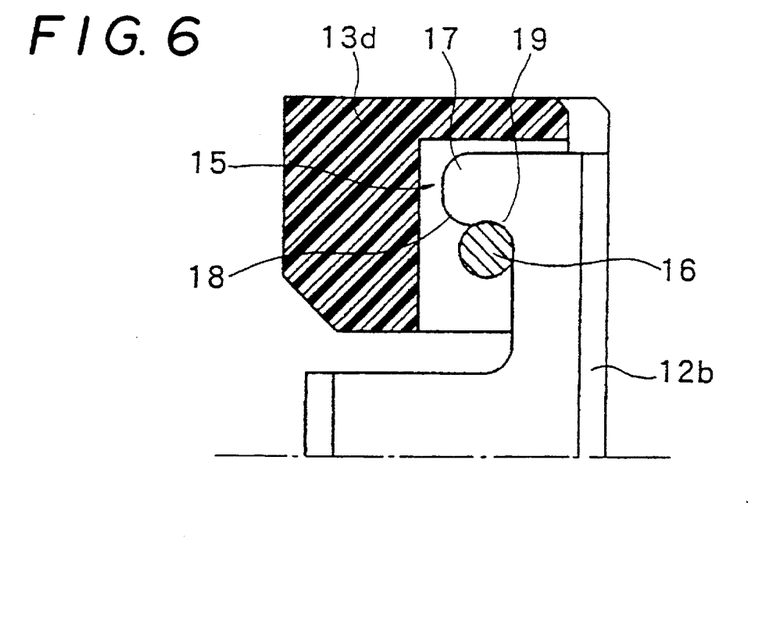
FIG. 6 is a sectional view of an engagement portion of one of the latch levers.

The corner blocks 13c and 13d are respectively provided with latch engagement grooves 15 which are opened to outer side surfaces thereof, respectively. As shown in FIG. 6, free ends of the latch levers 12a and 12b are respectively inserted into the engagement grooves 15 so as to engage the corner blocks 13c and 13d, respectively, within the engagement grooves 15. The corner block 13c has an engagement pin 16 of a metal which pierces all the way therethrough from the bottom of the latch engagement groove 15. A free end of each of the latch levers 12a and 12b is provided with a hook 17 which is removably engaged with this engagement pin 16.

Figure 5B:
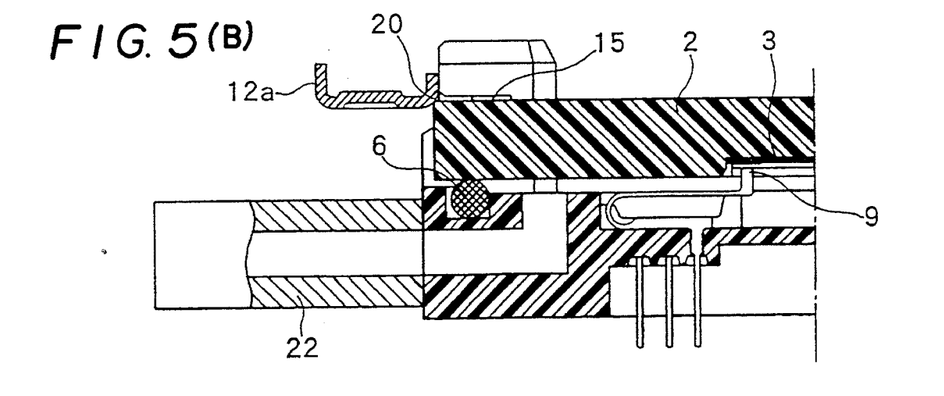
Figure 5C:
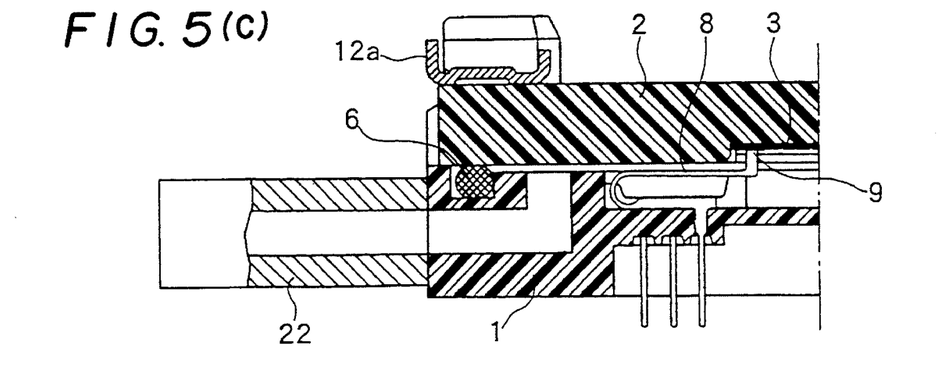

As shown in FIGS. 5(A) and 5(C), this hook 17 is inserted into the engagement groove 15 when the latch levers 12a and 12b are generally horizontally pivoted inwardly, and the hook 17 is engaged with the engagement pin 16 within the engagement groove 15. When the latch levers 12a and 12b are generally horizontally pivoted outwardly, the hook 17 and the engagement pin 16 are disengaged from each other. As shown in FIGS. 5(A), 5(B) and 5(C), upon insertion into the engagement grooves 15, the latch levers 12a and 12b depress the closing plate 2.

Specifically, as shown in FIG. 5(B), when the closing plate 2 is closed relative to the connector body 1 with the latch levers 12a and 12b removed from the corner blocks 13c and 13c, respectively, the closing plate 2 is placed on the upper surface of the annular air-tight sealing 6. At this time, as shown in FIG. 5(B), an upper edge of the closing plate 2 is present at the opening surface of the latch engagement groove 15 so as to limit the latch lever 12a (12b) from engaging in the engagement groove 15, and an inner edge of the latch lever 12a (12b), which is about to be inserted into the engagement groove 15, is abutted with an upper end of the closing plate 2 at an entrance of the engagement groove 15. In this condition, the latch lever 12a (12b) is forced into the engagement groove 15. As a result, the lever 12a (12b) climbs over the upper surface of the closing plate 2 while depressing the closing plate 2 against the resiliency of the annular air-tight sealing material 6. At the same time, the hook 17 is engaged in the engagement groove 15. Within the engagement groove 15, the hook 17 is forcibly engaged with the engagement pin 16. In other words, as shown in FIG. 6, the hook 17 is provided at a distal end portion thereof with an arcuate projection 18 for limiting the engagement of the engagement pin 16. This projection 18 climbs over the pin 16, while sliding on the surface of the pin 16 which has a circular sectional configuration, by the force imparted to the latch lever 12a (12b).

As a result, the engagement pin 16 enters a recess 19 at an inner side of the projection 18, thereby assuring an intimate engagement therebetween. As mentioned above, when the latch lever 12a (12b) is engaged in the engagement groove 15, it depresses the closing plate 2. With this depression, the closing plate 2, in turn, compresses the annular air-tight sealing material 6, and as a reaction thereof, the closing plate 2 and annular air-tight material 6 are intimately attached to each other. As a result, the air-tight chamber 7 is formed at an inner area of the annular air-tight sealing material 6. The closing plate 2 is pushed up by a restoring force of the annular air-tight sealing material 6. The closing plate 2, in turn, pushes up the latch lever 12a (12b) to press the hook 17 against an upper wall of the engagement groove 15.

As a consequence, the latch levers 12a and 12b and closing plate 2 are tightly combined with the connector body 1 without leaving any room for play, thereby defining an ideal air-tight chamber 7. Each of the latch levers 13a and 13b is provided at in inner edge thereof with a guide portion 20 for enhancing a smooth movement thereof for climbing over the upper surface of the closing plate 2. For example, the latch levers 12a and 12b are formed of metal plates, and edge portions of these metal plates are bent upwardly to form arcuate configurations, respectively, thereby forming the guide portions 20, respectively.

The connector body 1 or closing plate 2 thus constructed is provided with an air inlet/outlet port which is in communication with the air-tight chamber 7. For example, as shown in FIGS. 1, 2 and 5(A) as well as elsewhere, the connector body 1 is provided with an air inlet port 21 having a stop valve at a distal end thereof which is opened sidewardly of the connector body, and an air outlet port 22. The air inlet port 21 and air outlet port 22 are allowed to project sidewardly of the connector body 1. The connector body 1 is provided therein with an air inlet passage 23 which is in communication with the air inlet port 21, and an air outlet passage 24 which is in communication with the air outlet port 22. The air inlet passage 23 and air outlet passage 24 open through the bottom surface of the air-tight chamber 7 which is located at an inner side of the annular air-tight sealing material 6. The air inlet port 21 and air outlet port 22 are communicated with the air-tight chamber 7 respectively through the air inlet passage 23 and air outlet passage 24.

By means of connection of the air outlet port 22 to an air drawing source, air in the air-tight chamber 7 is removed to realize a vacuum condition within the air-tight chamber 7. At the same time, an oxidation preventive gas such as, nitrogenous gas or hydrogenous gas, is fed into the air-tight chamber 7 so as to fill the chamber 7 with the oxidation preventive gas. The IC 3 is electrically connected in a pressed condition to the contact noses 9 of the contacts 4 in such atmosphere.

As shown in FIG. 5(A), the closing plate 2 is provided at an inner surface thereof with an IC receiving portion 25 for receiving and retaining the IC 3, and the closing plate 2 with the IC 3 retained in the IC receiving portion 25 is closed relative to the connector body 1. Otherwise, the IC 3 is not retained by the closing plate 2, and after the IC 3 itself is inserted into the connector body 1, the closing plate 2 is closed relative to the connector body 1.

As shown in FIG. 5(B), in a state in which the latch lever 12a (12b) is not engaged in the engagement groove 15, the closing plate 2 is placed on the upper surface of the annular air-tight sealing material 6 by its dead weight and the contact points 5 of the IC 3 are spaced apart from and in a non-contact relation with the contact noses 9.

In the state of FIG. 5B, when the latch levers 12a and 12b are pushed into the engagement grooves 15, the closing plate 2 is depressed to compress the annular air-tight sealing material 6 and to press the contacts points 5 of the IC 3 against the noses 9 of the contacts 4. When the IC is pressed against the noses 9, the spring portions 8 of the contacts 4 are flexed downwardly to store resiliency, and the contact noses 9 are electrically connected in a pressed condition to the contact points 5 of the IC 3 by its restoring force, thereby forming the state of FIG. 5(C). In the state of FIG. 5(C), the gas is introduced into and removed from the air-tight chamber 7 through the gas inlet port 21 and gas outlet port 22.

Although not shown, gas inlet port 21 and gas outlet port 2 may be provided in the closing plate 2.

The gas may be introduced and removed through a single inlet/outlet port. It is also possible to provide only the gas outlet port 22 which is used for evaluating the air-tight chamber 7, instead of providing the gas inlet port 21.

Figure 7:
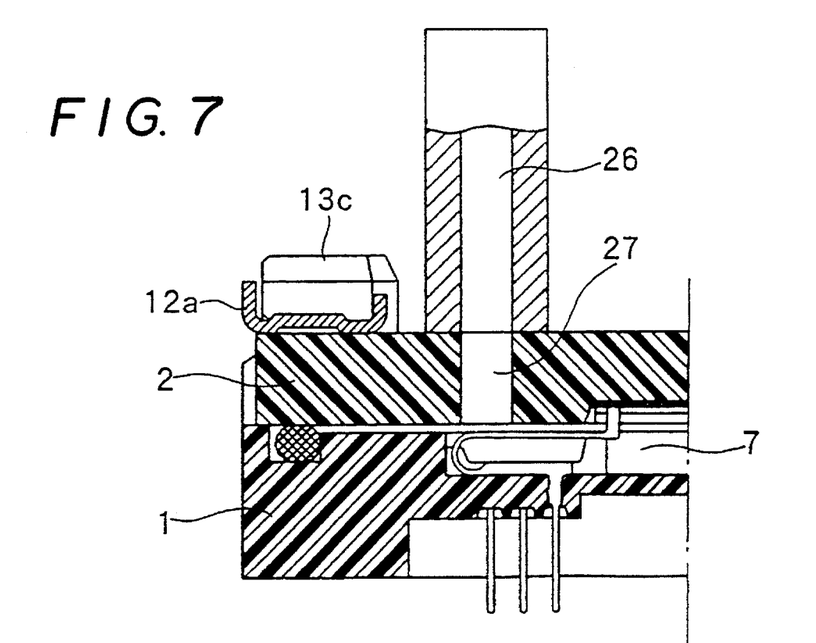
FIG. 7 is a sectional view of a connector for protecting an IC, but in which another example of a gas inlet/outlet port is illustrated.

FIG. 7 illustrates an example in which an air inlet/outlet port 26 is provided in the closing plate 2. As illustrated, the gas inlet/outlet port 26 projects upwardly from the upper surface of the closing plate 2, and this gas inlet/outlet port 26 is communicated with the air-tight chamber 7 through a gas inlet/outlet passage 27 which is formed in the closing plate 2. In the case where the gas inlet/outlet port projects sidewardly of the connector body 1, there is a possibility that a dead space is formed about the connector body 1 on a wiring board. However, as shown in FIG. 7, by providing the gas inlet/outlet port 26 at the upper surface of the closing plate 2, the dead space can be eliminated and the port 26 can easily be connected to a gas drawing source or a gas feeding source. Instead of providing the gas inlet/outlet port 26, a gas inlet port and a gas outlet port may be provided separately or only a gas outlet port may be provided as in the preceding embodiment.

Figure 8:
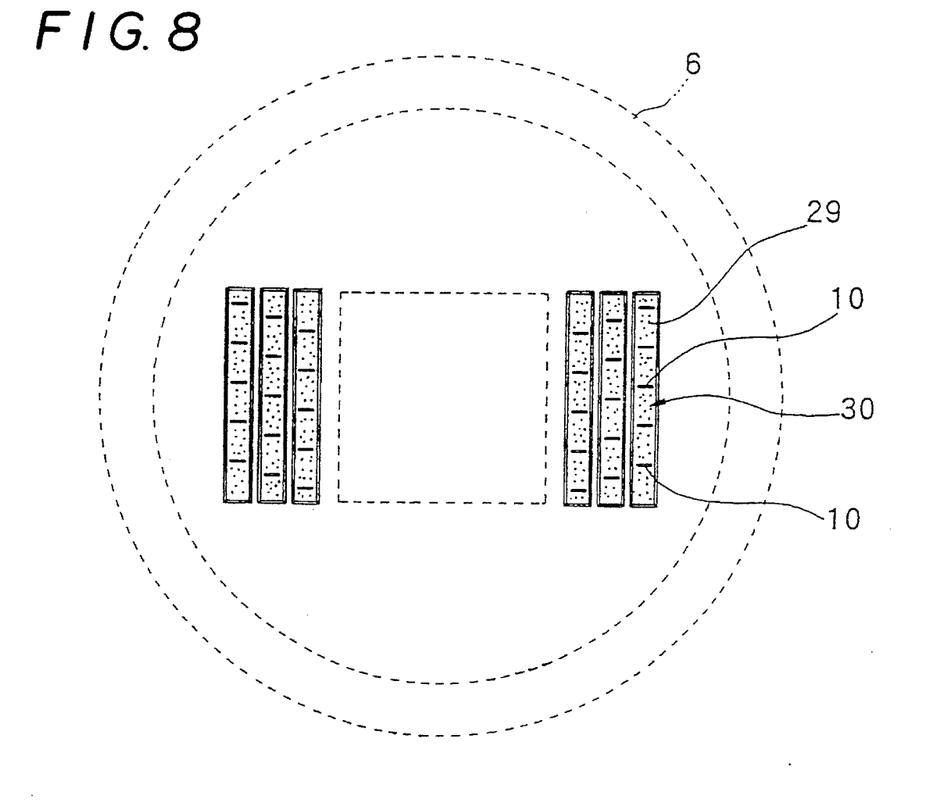
FIG. 8 is a bottom view showing a sealing structure of male terminal piercing portions of contacts.
Figure 9:
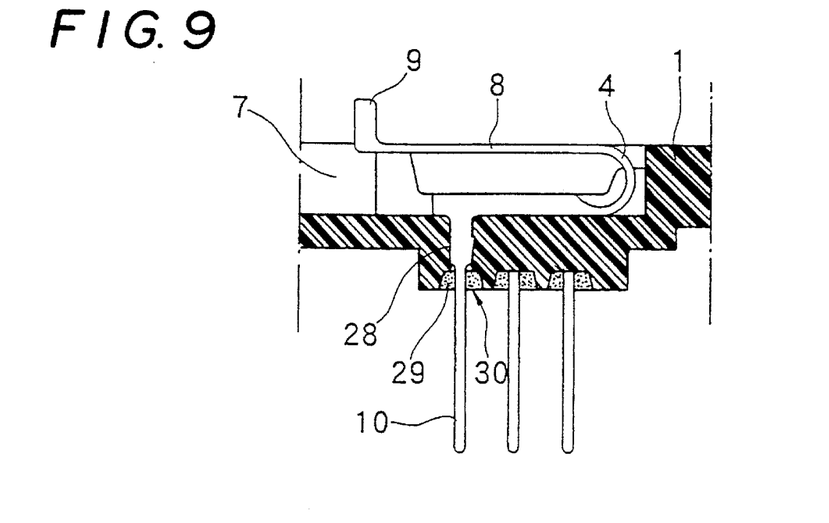
FIG. 9 is a sectional view of a connector, showing the sealing structure of FIG. 8.

FIGS. 8 and 9 show another embodiment in which a more ideal air-tight chamber 7 can be obtained.

As previously described, the male terminals 10 of the contacts 4 are pressed into and projected outwardly of a bottom wall of the air-tight chamber 7, i.e., contact implanting bores 28 which are formed in the connector body 1 which forms the bottom wall. Therefore, a very small space is formed between each implanting bore 28 and each male terminal 10 which is pressed into the bore 28. This means that there is a possibility that gas in the air-tight chamber 7 may leak through this very small space.

In the embodiment of FIGS. 8 and 9, the above problem is obviated by sealing the piercing portion of each male terminal 10 with a synthetic resin adhesive such as silicon or a sealing material 29 made of metal having a low melting point. As a concrete example, the outer surface of the connector body 1 from which the male terminals 10 project is provided with a plurality of sealing grooves 30 each having a bottom. In this embodiment, the male terminals 10 project outwardly through these sealing grooves 30 and sealing material is filled into these sealing grooves 30 in order to seal the implanting bores 28.

As one example, one sealing groove 30 is provided for each row of the male terminals 10 as shown in FIGS. 8 and 9. Alternatively, an arrangement is possible in which a sealing hole having a bottom is provided for each male terminal 10 in such a manner as to surround the male terminal, instead of providing the sealing grooves 30, and the sealing material 29 is filled into the sealing holes.

The construction of the connector body described with reference to FIGS. 1 to 5 is also totally applicable to the embodiment of FIGS. 8 and 9. Accordingly, the sealing material 29 may be filled in the grooves 30 shown in the sectional views of FIGS. 5(A) to 5(C).

The above connector for protecting an IC may function as an IC carrier for storing or transporting an IC, and this connector is connected directly to the wiring board or to a socket placed on the wiring board so as to be subjected to burn-in or similar testing. By this, the IC can be protected from becoming oxidized, duty, etc. in an economical manner.

This invention includes a case in which neither the connector body 1 or the closing plate 2 is provided with the gas inlet/outlet port. That is, by inserting the IC 3 into the air-tight chamber 7 in an atmospheric air of an oxidation preventive gas, the oxidation preventive gas can be filled in the air-tight chamber 7. Also, the IC can be prevented from having dust or dirt attached thereto simply by placing the IC 3 in the air-tight chamber 7 which is merely maintained in an air-tight condition, without filling the oxidation preventive gas in the air-tight chamber 7. Also, the IC can be prevented from being dirtied by replacing air in the air-tight chamber with a clean air, without using the oxidation preventive gas. Also, each contact of the connector body can be replaced with a wiring film having a conductive pattern or a conductive elastomer.

According to the present invention, an ideal air-tight chamber can easily be formed in a connector body using a closing plate and an annular air-tight sealing material, and a construction thereof can be very simple.

By placing the IC in the air-tight chamber, the contact points of the IC can effectively be prevented from becoming dirty. Also, by filling an oxidation preventive gas in the air-tight chamber or evacuating the air-tight chamber, the contact points of the IC accommodated in the air-tight chamber can be effectively prevented from becoming oxidized. Therefore, this device is very useful as a connector body for preventing an IC from being oxidized.

What is claimed is:

1. A connector for use with an IC, comprising:
   a connector body having an upper surface;
   a closure plate removably positioned on said connector body, said closure plate having a lower surface confronting said upper surface of said connector body when said closure plate is positioned thereon;
   an annular air-tight sealing material mounted on said upper surface of said connector body so as to be interposed between said upper surface of said connector body and said lower surface of said closure plate when said closure plate is positioned on said upper surface of said connector body;
   wherein an air-tight IC-receiving chamber is formed centrally of said annular air-tight sealing material and between said connector body and said closure plate when said closure plate is positioned on and pressed towards said upper surface of said connector body; and
   wherein at least one latch lever is pivotally mounted to said connector body for horizontally pivotal movement about a vertical pivot axis between a pressing position in which said at least one latch lever presses downwardly against said closure plate when said closure plate is positioned on said upper surface of said connector body, and a release position in which said at least one latch lever is free from engagement with said closure plate.

2. A connector as recited in claim 1, wherein
   said connector body has four corners;
   corner blocks are mounted to said connector body at two of said four corners, respectively, and project upwardly from said connector body;
   said latch lever has a base end pivotally mounted to a first of said corner blocks, and a free end engageable with a second of said corner blocks.

3. A connector as recited in claim 1, wherein
   said connector body has four corners;
   corner blocks are mounted to said connector body at said four corners, respectively, and project upwardly from said connector body;
   said at least one latch lever comprises two latch levers;
   each of said latch levers has a base end pivotally mounted to one of said corner blocks, and a free end engageable with another of said corner blocks.

4. A connector as recited in claim 3, wherein
   said free end of each of said latch levers has a hook formed thereon; and
   said corner blocks with which said free ends of said latch levers are engageable include engagement pins engagable with said hooks.

5. A connector as recited in claim 3, wherein
   said latch levers constitute a means for pressing downwardly linearly along two outer edges of said closure plate to compress said annular air-tight sealing member between said closure plate and said upper surface of said connector body.

6. A connector as recited in claim 1, further comprising
   a plurality of electrical contacts mounted to said connector body in said air-tight IC-receiving chamber.

7. A connector as recited in claim 6, wherein
   said at least one latch lever constitutes a means for pressing said closure plate toward said upper surface of said connector body to compress said annular air-tight sealing material between said closure plate and said upper surface of said connector body and to press an IC having contact points toward said upper surface of said connector body to cause electrical contact between said electrical contacts and the contact points of the IC.

8. A connector as recited in claim 1, wherein
   at least one gas port opens into said air-tight IC-receiving chamber, from outside said connector, through one of said closure plate and said connector body.

9. A connector as recited in claim 8, wherein
   said at least one gas port comprises a gas inlet port and a gas outlet port.

10. A connector as recited in claim 1, wherein
    an annular groove is formed in one of said upper surface of said connector body and said lower surface of said closure plate; and
    said annular air-tight sealing material is mounted in said annular groove.

11. A connector as recited in claim 1, further comprising
    a plurality of electrical contacts mounted to said connector body in said air-tight IC-receiving chamber;
    a plurality of male terminals electrically connected to and extending away from said contacts, respectively;
    wherein said connector body has terminal passages through which said male terminals respectively extend to outside of said connector; and
    wherein a sealing material is mounted to said connector body at said terminal passages to prevent gas leakage into said air-tight IC-receiving chamber through said terminal passages.

12. A connector as recited in claim 11, wherein
    outwardly opening sealing cavities are formed in an outer surface of said connector body at said terminal passages; and
    said sealing material is filled into said sealing cavities.

13. A connector for use with an IC, comprising:
    a connector body having an upper surface;
    a closure plate removably positioned on said connector body, said closure plate having a lower surface confronting said upper surface of said connector body when said closure plate is positioned thereon;

an annular air-tight sealing material mounted on said upper surface of said connector body so as to be interposed between said upper surface of said connector body and said lower surface of said closure plate when said closure plate is positioned on said upper surface of said connector body;

wherein an air-tight IC-receiving chamber is formed centrally of said annular air-tight sealing material and between said connector body and said closure plate when said closure plate is positioned on and pressed towards said upper surface of said connector body;

wherein a plurality of electrical contacts are mounted to said connector body in said air-tight IC-receiving chamber; and wherein said closure plate constitutes a means for compressing said annular air-tight sealing material between said closure plate and said upper surface of said connector body and for pressing an IC having electrical contact points toward said upper surface of said connector body to cause electrical contact between said electrical contacts and the electrical contact points of the IC.

14. A connector as recited in claim 13, wherein at least one gas port opens into said air-tight IC-receiving chamber, from outside said connector, through one of said closure plate and said connector body.

15. A connector as recited in claim 14, wherein said at least one gas port comprises a gas inlet port and a gas outlet port.

16. A connector as recited in claim 13, wherein an annular groove is formed in one of said upper surface of said connector body and said lower surface of said closure plate; and said annular air-tight sealing material is mounted in said annular groove.

17. A connector as recited in claim 13, further comprising a plurality of electrical contacts mounted to said connector body in said air-tight IC-receiving chamber;

a plurality of male terminals electrically connected to and extending away from said contacts, respectively;

wherein said connector body has terminal passages through which said male terminals respectively extend to outside of said connector; and wherein a sealing material is mounted to said connector body at said terminal passages to prevent gas leakage into said air-tight IC-receiving chamber through said terminal passages.

18. A connector as recited in claim 17, wherein outwardly opening sealing cavities are formed in an outer surface of said connector body at said terminal passages; and said sealing material is filled into said sealing cavities.

19. A connector for use with an IC, comprising:

a connector body having an upper surface;

a closure plate removably positioned on said connector body, said closure plate having a lower surface confronting said upper surface of said connector body when said closure plate is positioned thereon;

an annular air-tight sealing material mounted on said upper surface of said connector body so as to be interposed between said upper surface of said connector body and said lower surface of said closure plate when said closure plate is positioned on said upper surface of said connector body;

wherein an air-tight IC-receiving chamber is formed centrally of said annular air-tight sealing material and between said connector body and said closure plate when said closure plate is positioned on and pressed towards said upper surface of said connector body; and wherein at least one gas port opens into said air-tight IC-receiving chamber, from outside said connector, through one of said closure plate and said connector body.

20. A connector as recited in claim 19, wherein said at least one gas port comprises a gas inlet port and a gas outlet port.

21. A connector as recited in claim 19, wherein an annular groove is formed in one of said upper surface of said connector body and said lower surface of said closure plate; and said annular air-tight sealing material is mounted in said annular groove.

22. A connector as recited in claim 19, further comprising a plurality of electrical contacts mounted to said connector body in said air-tight IC-receiving chamber;

a plurality of male terminals electrically connected to and extending away from said contacts, respectively;

wherein said connector body has terminal passages through which said male terminals respectively extend to outside of said connector; and wherein a sealing material is mounted to said connector body at said terminal passages to prevent gas leakage into said air-tight IC-receiving chamber through said terminal passages.

23. A connector as recited in claim 22, wherein outwardly opening sealing cavities are formed in an outer surface of said connector body at said terminal passages; and said sealing material is filled into said sealing cavities.

* * * * *